United States Patent [19]

Benson et al.

[11] 4,149,311
[45] Apr. 17, 1979

[54] WORK STATION FOR FACILITATING COMPONENT ASSEMBLY

[75] Inventors: Richard A. Benson, Canterbury, N.H.; Wayne E. McKinnon, Landisville, Pa.

[73] Assignee: Banner/Technical Devices Inc., Culver City, Calif.

[21] Appl. No.: 835,573

[22] Filed: Sep. 22, 1977

[51] Int. Cl.² .............................................. H05K 3/30
[52] U.S. Cl. ..................................... 29/741; 29/759; 29/760; 269/321 WE
[58] Field of Search ................. 29/741, 759, 760, 739; 269/321 WE

[56] References Cited

U.S. PATENT DOCUMENTS

| 3,548,493 | 12/1970 | Hubbard | 29/741 X |
| 3,760,484 | 9/1973 | Kowalski | 29/739 X |

Primary Examiner—Carl E. Hall
Attorney, Agent, or Firm—Richard J. Rengel

[57] ABSTRACT

An upper working surface holds a circuit board for assembly of circuit components which are gravity fed under the surface through carrier tubes to lower level pick-off stations receiving the components from respective carrier tubes, the pick-off stations project past the lower edge of the working surface to expose the components to be readily accessible for pick-off and assembly.

8 Claims, 4 Drawing Figures

WORK STATION FOR FACILITATING COMPONENT ASSEMBLY

BACKGROUND OF THE INVENTION

The present invention relates to work stations for assembly of components and more particularly for holding a work piece and locating and dispensing components in an improved manner for assembly.

In many prior arrangements, a work station included a work surface and holder for assembly of components to form structures such as assembled printed circuit boards. The work surface holds a circuit board or other structure to be completed by addition of components. The components are placed in bins and an assembler selects the components from the bins and places them on the work piece structure to complete the assembly or step in the assembly of the structure.

SUMMARY OF THE INVENTION

The present invention overcomes many of the difficulties of the prior art arrangement by providing for feeding of components from carrier tubes under the work surface to individual pick-off stations. The individual pick-off stations locate the components in an organized array along the lower edge of the work surface at a lower level. The individual components are positioned to facilitate pick-up since they are spaced and exposed to be readily grasped and oriented in the proper direction for positioning on the circuit board. Accordingly, it is an object of the present invention to provide an improved work station having the foregoing features and advantages.

Another object is the provision of a work station in which a plurality of components are fed under a printed circuit board to respective pick-off stations.

A further object is to provide a structure for assembly of components on a work surface by feeding the components under the work surface to be exposed along the edge of the surface.

Still another object is to provide for assembly of electrical components on a circuit board by feeding the components under a work surface through component carrier tubes to respective pick-off stations along the adjacent edge of the circuit board.

These and other objects of the invention will become apparent to those skilled in the art from the following detailed description of the preferred embodiment.

DETAILED DESCRIPTION OF PREFERRED EMBODIMENTS OF THE PRESENT INVENTION

Figure 1:
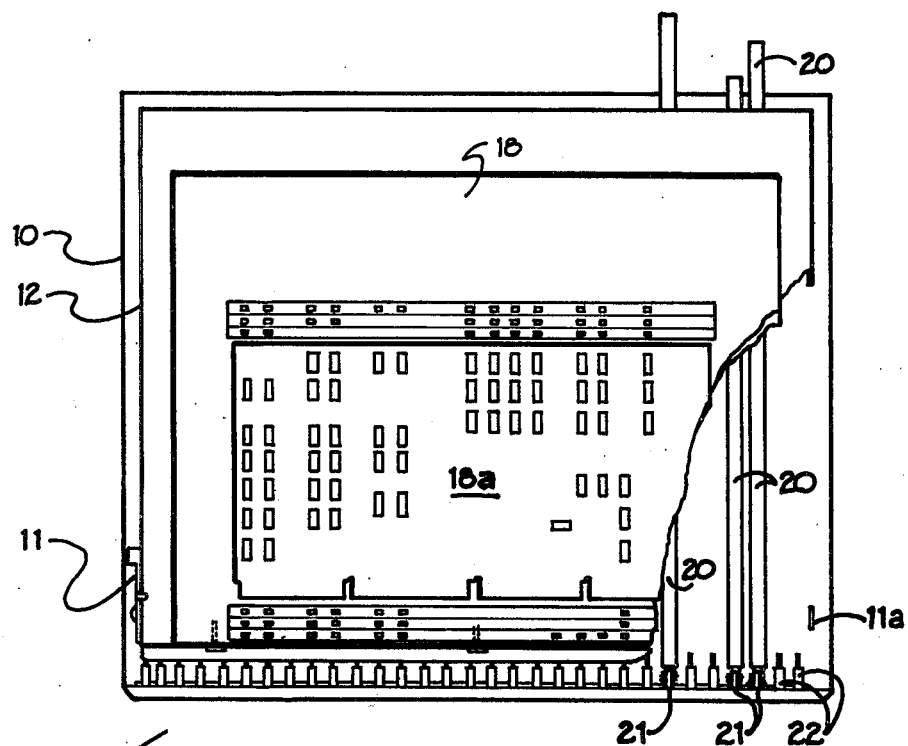
FIG. 1 is a front elevation of the work station of the present invention; partly broken away to show details thereof.
Figure 3:
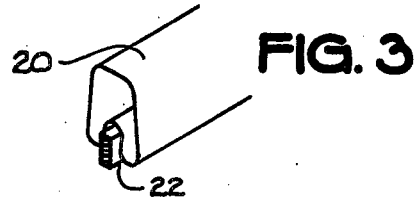
FIG. 3 shows a typical component holder of carrier tube for feeding components to the pick-off area of the work station.
Figure 4:
FIG. 4 shows a typical integrated circuit component.

Referring to FIG. 1, the work station of the preferred embodiment of the present invention is shown to comprise a lower inclined base panel 10 and an upper, spaced work surface of shelf panel 12 supporting a printed circuit card holder 18 having a partially assembled printed circuit card 18a disposed thereon. The shelf 12 is removably and adjustably secured to the base panel 10 by lower locking levers 11 and upper tabs 11b projecting through opposing slotted openings in the base panel 10. The levers 11 and tabs 11b are secured to the sides of shelf flanges and rotation of levers 11 causes the lower cam surface to engage the top of the base panel 10 to raise the shelf 12 from the base panel for insertion and removal of component carrier tubes 20 from locators 22 at respective exposed pick-off stations. A typical carrier tube is shown in FIG. 3 to have a generally U shaped configuration, i.e. inverted U that seats on the upper, tapered end portion of locator 22.

Figure 2:
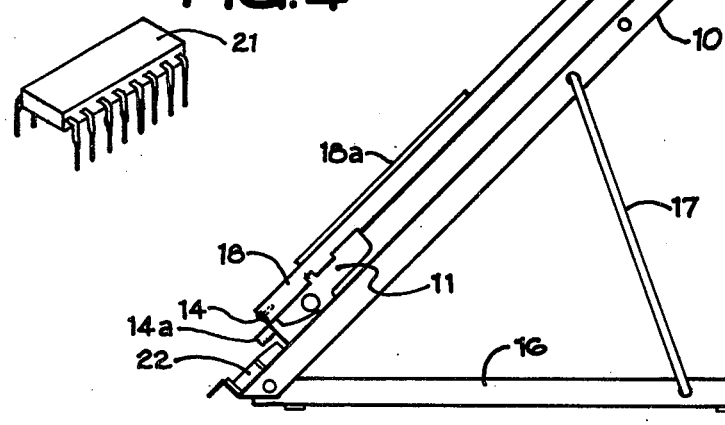
FIG. 2 is a side elevation of the work station shown in FIG. 1.

As shown in FIGS. 1 and 2, the locking levers 11 secure the shelf 12 to the base 10 along a pressure foot or strip 14 including a resilient, compressible strip 14a which presses against the lower ends of carrier tubes 20 to maintain them seated on the upper ends of respective tapered locators 22. The ends of carrier tubes 20 pass longitudinally over the tapered ends of locators 22 to abut the chambered portion whereby dual-in-line packaged integrated circuits 21, i.e. DIP, feed by gravity from the carrier tubes into the larger lower sections of the respective locators 22 as shown in FIG. 1. The spacing of component leads is greater than the width of the larger section of locators 22 whereby the components feed down on the locators to be picked-off by the fingers of the assembler. Accordingly, the locators 22 and components 21 are spaced to be exposed and conveniently located for pick-off and placement on the printed circuit board 18a supported in position on holder 18.

The base panel 10 is supported by a stand including lower strips 16 pivotally secured to the lower edge of the base panel flange and braces 17 located in flange openings, on each side of base panel 10, for adjusting the angle of inclination of the panels and workpiece positioned thereon, e.g. 30° to 45°.

Loading of components into the work station of the preferred embodiments is provided by moving levers 11 at both sides of top shelf panel to an upright position, a counter clockwise rotation of lever 11 about the pin as shown in FIG. 2, causing the cam surface to engage the base panel along the opposing area thereof. This rotation moves the lower projections into alignment with the opposing slotted area to permit the raising of the lower edge of shelf 12.

The components supplied in carrier tubes 20 are loaded from the lower front or upper rear between the space between the base and top shelf panels, and positioned on respective locators 22 by seating the carrier tubes 20 on the narrow upper portion of the respective locators 22 and the ends of the tubes 20 against the chamfered portions of the locators as shown in FIGS. 1 and 2.

After the carrier tubes 20 have been positioned, the locking levers are lowered, i.e. rotated clockwise as shown in FIG. 2, to clamp the tubes 20 in position by pressure foot 14. The pressure foot being fastened to shelf panel 12, it moves down with the panel during clamping. Since the height of component carrier tubes 20 vary, the position of the pressure foot is adjustable by slotted openings in opposing flanges of the pressure foot and shelf panel. The bolt fasteners for foot and panel are shown passing through the slots and are visible in FIGS. 1 and 2.

An important feature of the invention is the spacing of the locators 22 to provide for manual removal of individual components and the distance between the lower edge of the shelf panel 12 relative to the locators 22 to permit removal of components of different lengths e.g. up to 18 lead DIP's. Thus, the length of the larger portion of locators 22 is as long as the longest component to completely pass individual components out of the carrier tubes, in sequence onto the lower wider portion of locators 22 as shown.

One of the most important features of the present invention is the provision of passing components under the workpiece, i.e., the workpiece is disposed above the component carrier tubes so that the components are fed under the workpiece to be available at a series of pick-off stations along the length of lower edge thereof and next to the assembler. This arrangement locates many pick-off stations directly in front of the work piece and assembler and along the entire adjacent edge of the work station. Since the components such as DIPS are supplied in carrier tubes, as shown in the drawings, the carrier tubes are located to feed components under the circuit board and its holder to pick-off stations directly in front of the assembler for easy access and placement on the circuit board.

Programming the selection position and orientation of DIPs for example, is facilitated by novel structure and arrangement of the present invention. For example, numbering of the pick-off stations and corresponding numbered squares of the holder in those rows above and below the circuit board.

While a preferred embodiment of the invention has been disclosed, it should be clear that the present invention is not limited thereto as many variations and additional embodiments will be apparent to those skilled in the art.

We claim:

1. A work station for facilitating the locating and positioning of components; said work station comprising:
    an upper support member for holding a printed circuit board or the like which in turn receives and retains said components;
    a component feed and pick-off assembly including lower support means therefor for supporting said assembly below and in spaced relation to said upper support member, said assembly including component feed means comprising a plurality of elongated carrier tubes disposed below said upper support member for feeding components under said upper support member;
    said assembly further including individual component locator means disposed and aligned to receive components supplied from respective ones of said feed tubes for providing individual component pick-off stations, said component locator means being supported by said lower support means to project beyond the upper support member for receiving and locating a plurality of individual components in alignment to be concurrently and readily accessible for pick-off and placement.

2. The work station according to claim 1 in which said locator means comprises individual elements tapered to receive the ends of respective tubes which abut intermediate, larger portions of the tapered elements to support the corresponding tubes for sequentially passing components onto the larger portions of the elements.

3. The work station according to claim 1 in which said locator means comprises individual tapered elements disposed to receive the ends of respective tubes, said tubes having inverted U shape ends abutting an intermediate larger portion of the respective elements for sequentially passing slidably disposed components from the tubes onto the larger portion of the elements.

4. The work station according to claim 1 in which said locator means comprises a row of tapered elements each having smaller end portions disposed for receiving corresponding end portions of said carrier tubes and passing components from the tubes onto the larger portion of respective ones of said tapered elements.

5. The work station according to claim 4 in which said lower support means for the component feed and pick-off assembly includes a stand having means for supporting said tubes, slidably retaining said components, at an angle to produce feeding of said components on respective tapered elements by gravity.

6. The work station according to claim 4 in which said upper support member includes means for retaining a printed circuit board and said locator means comprises means for receiving and dispensing a plurality of electrical components,
    said electrical components having parallel leads extending therefrom to project about the sides of the larger portion of respective ones of said tapered elements.

7. The work station according to claim 6 in which said electrical components comprise dual-in-line integrated circuit packages having an elongated body portion and parallel leads extending from longitudinal sides thereof.

8. The work station according to claim 6 in which said electrical components comprise an integrated circuit package each consisting of a flat rectangular body having subtending parallel leads and said carrier tubes slidably support the packages for sequential feeding of individual ones from the end of the tube.

* * * * *